(12) United States Patent
Peng

(10) Patent No.: US 9,811,191 B2
(45) Date of Patent: Nov. 7, 2017

(54) ARRAY SUBSTRATE AND MANUFACTURE METHOD THEREOF, AND TOUCH DISPLAY PANEL

(71) Applicants: Xiamen Tianma Micro-Electronics Co., Ltd., Xiamen (CN); Tianma Micro-Electronics Co., Ltd., Shenzhen (CN)

(72) Inventor: Tao Peng, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 3 days.

(21) Appl. No.: 14/818,292

(22) Filed: Aug. 4, 2015

(65) Prior Publication Data

US 2016/0328058 A1 Nov. 10, 2016

(30) Foreign Application Priority Data

May 8, 2015 (CN) .......................... 2015 1 0232368

(51) Int. Cl.
*G02F 1/1343* (2006.01)
*G06F 3/041* (2006.01)
(Continued)

(52) U.S. Cl.
CPC ...... *G06F 3/0412* (2013.01); *G02F 1/134363* (2013.01); *H01L 27/124* (2013.01); *H01L 27/1222* (2013.01); *H01L 27/1248* (2013.01); *H01L 27/1259* (2013.01); *G02F 1/13338* (2013.01); *G02F 1/136227* (2013.01);
(Continued)

(58) Field of Classification Search
CPC .................................................. G02F 1/134363
See application file for complete search history.

(56) References Cited

U.S. PATENT DOCUMENTS 6,208,399 B1 * 3/2001 Ohta ................. G02F 1/134363
349/139
2001/0010573 A1 * 8/2001 Ohta ................. G02F 1/134363
349/139
(Continued)

FOREIGN PATENT DOCUMENTS

CN 102750024 A 10/2012
CN 103176302 A 6/2013
(Continued)

*Primary Examiner* — Phu Vu
(74) *Attorney, Agent, or Firm* — Faegre Baker Daniels

(57) ABSTRACT

An array substrate, a manufacture method thereof and a touch display panel. The array substrate includes a base; a plurality of thin film transistors arranged in a matrix form, each of which including a gate electrode, a source electrode and a drain electrode; a first insulation layer located on the thin film transistor; a touch wiring layer which is disposed on the first insulation layer and includes a plurality of touch wirings; and a planarization layer covering the touch wiring layer. In some embodiments of the disclosure, the planarization layer covers the touch wiring layer, making the flatness over the touch wirings better, thus alleviating the light leakage at both sides of the touch wiring after the rubbing process.

17 Claims, 5 Drawing Sheets

(51) Int. Cl.
*H01L 27/12* (2006.01)
*G02F 1/1333* (2006.01)
*G02F 1/1362* (2006.01)

(52) U.S. Cl.
CPC ............... *G02F 1/136286* (2013.01); *G06F 2203/04103* (2013.01)

(56) References Cited

U.S. PATENT DOCUMENTS

| | | |
|---|---|---|
| 2008/0252802 A1 | 10/2008 | Wang et al. |
| 2010/0194697 A1 | 8/2010 | Hotelling et al. |
| 2011/0227850 A1* | 9/2011 | Oh .................. G02F 1/13338 345/173 |
| 2011/0227851 A1 | 9/2011 | Oh et al. |
| 2012/0162104 A1* | 6/2012 | Chang .................. G06F 3/0412 345/173 |
| 2013/0077034 A1 | 3/2013 | Jung et al. |
| 2014/0347589 A1 | 11/2014 | Kim et al. |
| 2015/0194443 A1 | 7/2015 | Chen et al. |

FOREIGN PATENT DOCUMENTS

| | | |
|---|---|---|
| CN | 103823315 A | 5/2014 |
| CN | 104460080 A | 3/2015 |
| CN | 104503172 A | 4/2015 |
| CN | 104599651 A | 5/2015 |
| CN | 104698709 A | 6/2015 |

* cited by examiner

ARRAY SUBSTRATE AND MANUFACTURE METHOD THEREOF, AND TOUCH DISPLAY PANEL

CROSS-REFERENCE TO RELATED APPLICATION

This application claims priority to Chinese Application No. 201510232368.5, filed May 8, 2015, which is herein incorporated by reference in its entirety.

TECHNICAL FIELD

The present disclosure relates to the field of liquid crystal display technologies and, more particularly, to an array substrate and a manufacture method thereof, and a touch display panel.

BACKGROUND

A Liquid Crystal Display (LCD) is a flat-panel display. With the development of science and technology, electronic products containing LCDs are developed to be light-weight, thin, short and compact, and have advantages such as right-angle displays, low power consumption, a small size, and being free of radiation, which can allow users to enjoy the best visual environment.

A display having a touch sensing function is derived from technology for function diversity, and common touch technology includes in-cell touch technology and on-cell touch technology. The in-cell touch technology refers to embedding a touch sensing function into liquid crystal pixel circuitry, while the on-cell touch technology refers to embedding a structure for the touch sensing function between a color filter substrate and a polarizing plate. The in-cell touch technology makes the display thinner and thus arouses more attention.

FIG. 1 shows an array substrate having a touch sensing function in the related art. The array substrate includes, from bottom to top, a base 111; a polycrystalline silicon layer 112 formed on the base 111; a coated gate insulation layer 113; a first metal layer, in which gate electrodes 114 of thin film transistors (TFTs) and scan lines are formed by a patterning process; an interlayered insulation layer 115 covering the patters in the first metal layer; a second metal layer, in which source electrodes 116, drain electrodes 125 of the TFTs and data lines are formed by the patterning process; a planarization layer 118; a third metal layer (M3) formed on the planarization layer 118, where touch wirings 119 are formed in the third metal layer by the patterning process; a first insulation layer 120; touch sensing electrodes 121 formed on the first insulation layer 120, where the touch sensing electrodes 121 can also operate as common electrodes; a second insulation layer 122; a first via hole 123 formed by etching the second insulation layer 122, the first insulation layer 120 and the planarization layer 118, and a second via hole 124 formed by etching the second insulation layer 122 and the first insulation layer 120; and a pixel electrode 117 formed on the second insulation layer 122 and electrically connected with the drain electrode 125 of the thin film transistor through the first via hole 123, where a bridge structure is formed by the material of the pixel electrode, to electrically connect the touch sensing electrode 121 to the touch wiring 119 through the second via hole 124.

However, in the array substrate formed as above, the touch wiring is formed on the planarization layer, thus the surface of the film layer on the touch wiring is not flat, thereby severely affecting the effect of the subsequent rubbing process, and easily leading to light leakage at both sides of the touch wiring.

SUMMARY

Embodiments of the present disclosure provide an array substrate and a manufacture method thereof, and a touch display panel, where the planarization layer is disposed on the touch wiring layer, so that the flatness of the film layers above the touch wirings is improved, thereby alleviating the light leakage after the rubbing process.

In a first example, embodiments of the disclosure provide an array substrate, including:

a base;

a plurality of thin film transistors arranged in a matrix form, each of which includes a gate electrode, a source electrode and a drain electrode;

a first insulation layer located on the thin film transistors;

a touch wiring layer which is disposed on the first insulation layer and comprises a plurality of touch wirings; and a planarization layer covering the touch wiring layer.

In a second example, embodiments of the disclosure provide a touch panel display, including the array substrate of the first example of the disclosure, where the touch panel display further includes a color filter substrate arranged opposite to the array substrate, and a liquid crystal layer disposed between the array substrate and the color filter substrate.

In a third example, embodiments of the disclosure provide a manufacturing method of the array substrate, including:

S1. forming a first metal layer on a base, and forming patterns of gate electrodes and scan lines on the first metal layer by a patterning process, wherein the scan lines extend along a first direction;

S2. forming a third insulation layer on the first metal layer;

S3. forming a second metal layer on the third insulation layer, and forming patters of source electrodes, drain electrodes and data lines on the second metal layer by the patterning process, wherein the data lines extend along a second direction intersecting the first direction;

S4. forming a first insulation layer on the second metal layer;

S5. forming a touch wiring layer on the first insulation layer, the touch wiring layer including a plurality of touch wirings extending along the second direction; and S6. forming a planarization layer on the touch wiring layer.

In embodiments of the disclosure, the planarization layer is disposed on the touch wiring layer, so that the flatness of the film layers above the touch wirings is made better, thus alleviating the light leakage after the rubbing process.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

Figure 1:
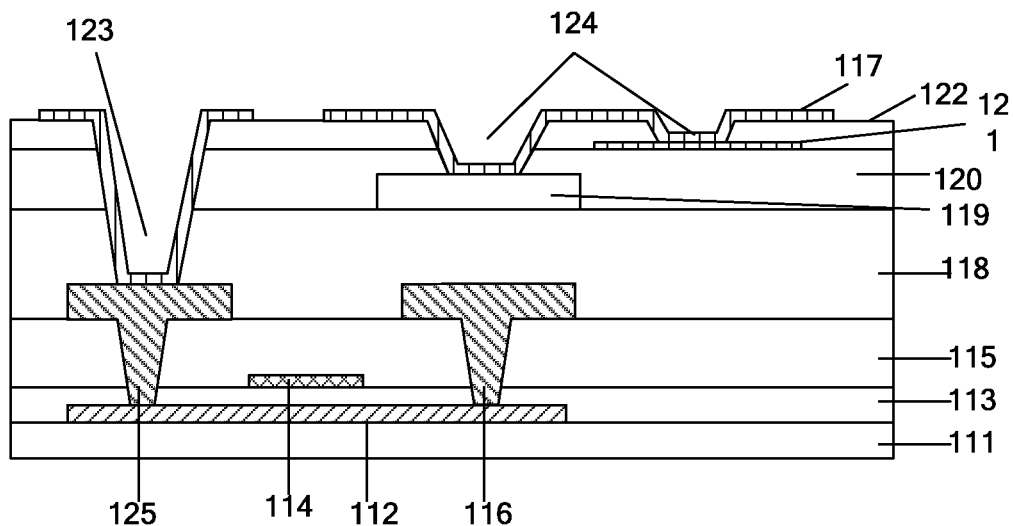
FIG. 1 is a schematic cross-section of an array substrate provided in the related art.

While the disclosure is amenable to various modifications and alternative forms, embodiments have been shown by way of example in the drawings and are described in detail below. The intention, however, is not to limit the disclosure to the embodiments described. On the contrary, the disclosure is intended to cover all modifications, equivalents, and alternatives falling within the scope of the disclosure as defined by the appended claims.

DETAILED DESCRIPTION

The present disclosure will be further described in details below in combination with the accompanying drawings and the embodiments. It should be understood that the embodiments described herein are merely for illustrating the disclosure but not for limiting the same. It also should be noted that, for ease of description, the drawings illustrate merely some parts, but not all structures, associated with the disclosure.

Figure 2:
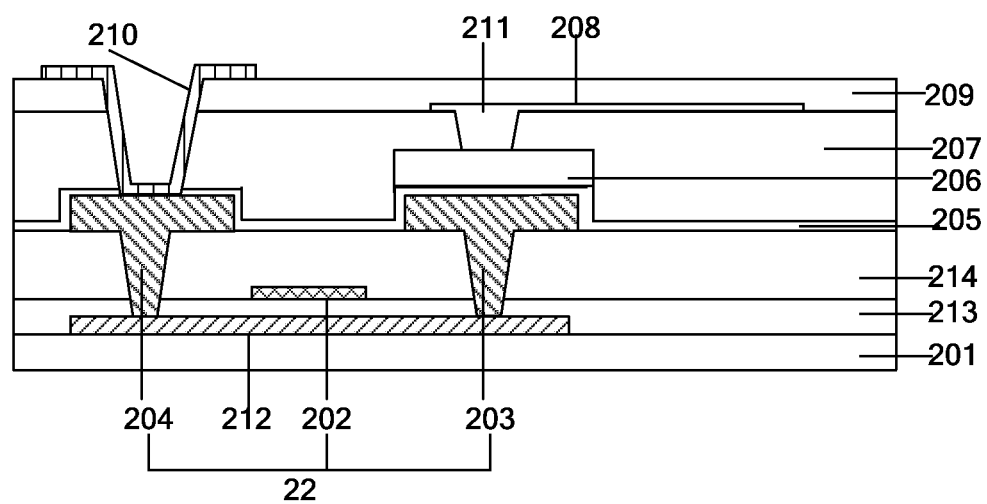
FIG. 2 is a schematic cross-section of an array substrate, according to embodiments of the disclosure.

FIG. 2 is a schematic cross-section of an array substrate, according to embodiments of the disclosure. As shown in FIG. 2, the array substrate described by the disclosure includes:

a base 201; a plurality of thin film transistors 22 arranged in a matrix form, each of which include a gate electrode 202, a source electrode 203 and a drain electrode 204; a first insulation layer 205 located on the thin film transistor 22; a touch wiring layer which is disposed on the first insulation layer 205 and includes a plurality of touch wirings 206; and a planarization layer 207 covering the touch wiring layer.

The touch wirings 206 are formed beneath the planarization layer 207, avoiding the light leakage at both sides of the touch wiring after the rubbing process due to the uneven surface of a film layer disposed on the touch wirings 206.

In some embodiments, the hierarchy relationship of other structures is not limited. One example implementation is provided below, as shown in FIG. 2, the array substrate further includes: a common electrode layer which is located on the planarization layer and includes a plurality of common electrodes 208, each of which is connected with one or more touch wirings 206 and can also operate as a touch sensing electrode; a second insulation layer 209 located on the common electrode layer; and a pixel electrode layer which is located on the second insulation layer 209 and includes a plurality of pixel electrodes 210.

The common electrode 208, which is operable as the touch sensing electrode, can be connected to the touch wiring 206 in various ways. In some embodiments, the planarization layer 207 includes a first via hole 211, through which the common electrode 208 is directly connected with the touch wiring 206, as shown in FIG. 2.

The array substrate further includes: a plurality of scan lines extending along a first direction, which are located at the same layer as the gate electrode 202 of the thin film transistor; and a plurality of data lines extending along a second direction intersecting the first direction, which are located at the same layer as the source electrode 203 and the drain electrode 204 of the thin film transistor, where the extending direction of the touch wirings 206 is the same as that of the data lines.

In some embodiments, the array substrate can be manufactured by the following procedure including the steps of:

A. forming a pattern of a polycrystalline silicon (Poly-Si) layer 212 on the base 201 using a patterning process, the polycrystalline silicon layer 212 being an active layer and being made of amorphous silicon or low-temperature polycrystalline silicon;

B. forming a gate insulation layer 213 on the base 201 provided with the formed pattern;

C. forming a first metal layer on the gate insulation layer 213, and forming the gate electrode 202 of the thin film transistor 22 and the scan lines by etching the first metal layer using a patterning process;

D. forming an interlayered insulation layer 214, which is made of silicon nitride, silicon oxide or the like, on the gate electrode 202;

E. forming a second metal layer on the interlayered insulation layer 214, and forming the source electrode 203 and the drain electrode 204 of the thin film transistor and the data lines by etching the second metal layer using a patterning process;

F. forming the first insulation layer 205, which may be made of silicon oxide or silicon nitride, on the source electrode 203, the drain electrode 204 and the data lines;

G. forming the touch wiring layer on the first insulation layer 205, and etching the touch wiring layer to form the plurality of touch wirings 206 by a patterning process;

H. forming the planarization layer 207 on the touch wirings 206, that is, solidifying a liquid organic film over the touch wirings 206 to form a flat layer on the touch wirings 206. The thickness of the formed planarization layer 207 is generally between 0.5 μm and 6 μm, preferably 2.2 μm. The planarization layer 207 is also electrically insulative, but is not equivalent to the insulation layer in the prior art. The planarization layer 207 and the insulation layer in the prior art are essentially different in material, for example, the planarization layer 207 is made of an organic film while the insulation layer is made of silicon nitride or silicon oxide. In addition, the process for manufacturing the planarization layer 207 is essentially different from that for manufacturing the insulation layer, because the planarization layer 207 is generally formed by solidifying the liquid organic film on the target film layer to be covered and then the desired pattern is formed in the planarization layer 207 by a photoetching process, while the insulation layer is deposited typically by Chemical Vapor Deposition (CVD), and the final pattern is formed in the insulation layer by a combination of the photoetching process and an etching process;

I. forming the first via hole 211 in the planarization layer 207 at a position corresponding to the touch wiring 206 by etching;

J. further forming the common electrode layer on the planarization layer 207, for example, with Indium Tin Oxide (ITO), and etching the common electrode layer to form a pattern of the plurality of common electrodes by the patterning process. The common electrode layer, which is located on the planarization layer 207, includes a plurality of common electrodes 208, each of which is connected with one or more of the touch wirings 206 and is operable as a touch sensing electrode. Where, each of the common electrodes 208 may be directly connected with the touch wiring 206 through the first via 211.

K. forming the second insulation layer 209, which is made of silicon oxide or silicon nitride, on the common electrode layer;

L. etching the second insulation layer 209, the planarization layer 207 and the first insulation layer 205 at a position corresponding to the drain electrode 204 to form a via hole; and M. forming the pixel electrode layer on the second insulation layer 209, and forming the pattern of the pixel electrode 210 by etching the pixel electrode layer using a patterning process, the pixel electrode 210 being connected with the drain electrode 204 by the via hole. Here, the pixel electrode layer is a transparent electrode layer, and may be made of a material that is the same as that of the common electrode layer, such as ITO. The pixel electrode 210 includes at least two strip-shaped electrodes, the extending direction of which is the same as that of the touch wirings 206.

In some embodiments, the planarization layer covers the touch wiring layer, making the flatness over the touch wirings better, thus alleviating the light leakage at both sides of the touch wiring after the rubbing process.

Figure 3:
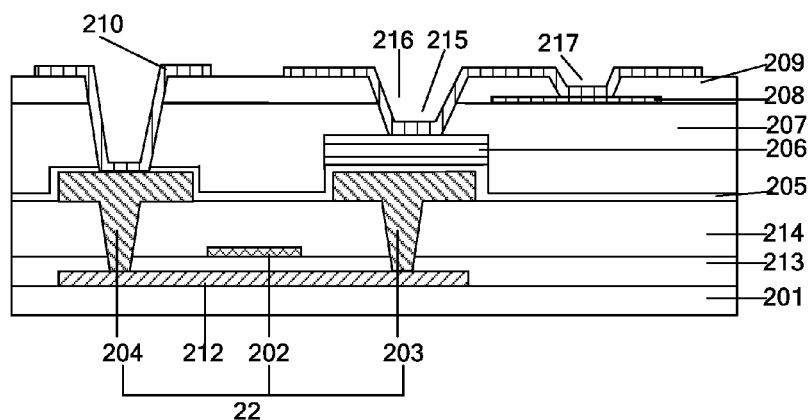
FIG. 3 is a schematic cross-section of an array substrate, according to embodiments of the disclosure.

FIG. 3 is a schematic cross-section of an array substrate, according to embodiments of the disclosure. The difference between embodiments described in combination with FIG. 3 and embodiments described in combination with FIG. 2 lies in that, in the embodiments of FIG. 3, the planarization layer 207 includes a first via hole 215, through which the common electrode 208 is connected with the touch wiring 206. In particular, the second insulation layer 209 includes a second via hole 216 aligning with the first via hole 215 and a third via hole 217, so that the common electrode 208 is connected with the touch wiring 206 through the first via hole 215, the second via hole 216 and the third via hole 217.

In the actual manufacturing process, the above-described step I may be omitted, in this case, the third via hole 217, the first via hole 215 and the second via hole 216 are formed at the same time by etching in step L.

When the pixel electrode layer is formed in step M, a bridge structure is meanwhile formed by etching, to connect the common electrode 208 with the touch wiring 206 through the first via hole 215, the second via hole 216, and the third via hole 217.

In some embodiments, the planarization layer covers the touch wiring layer, making the flatness over the touch wirings better, thus alleviating the light leakage after the rubbing process. Further, these embodiments can further omit one step of forming the via hole.

Figure 4A:
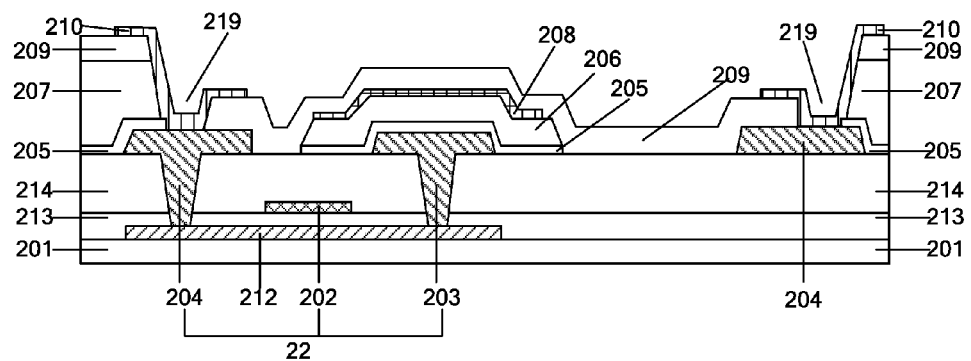
FIG. 4A is a schematic cross-section of an array substrate, according to embodiments of the disclosure.

FIG. 4A is a schematic cross-section of an array substrate, according to embodiments of the disclosure. Embodiments are based on embodiments described in combination with FIG. 2, but are different therefrom in that the planarization layer 207 includes first slots (i.e. openings) 218, which each extend from a drain electrode 204 of a thin film transistor to a drain electrode 204 of the adjacent thin film transistor in the first direction, as shown in FIG. 4B.

The first slot 218 penetrates through the planarization layer 207 and the first insulation layer 205. The common electrode layer extends into the first slot 218 along the second direction to connect with the touch wiring 206. Within the first slot 218, only the touch wiring 206 is covered with the common electrode layer.

Figure 4B:
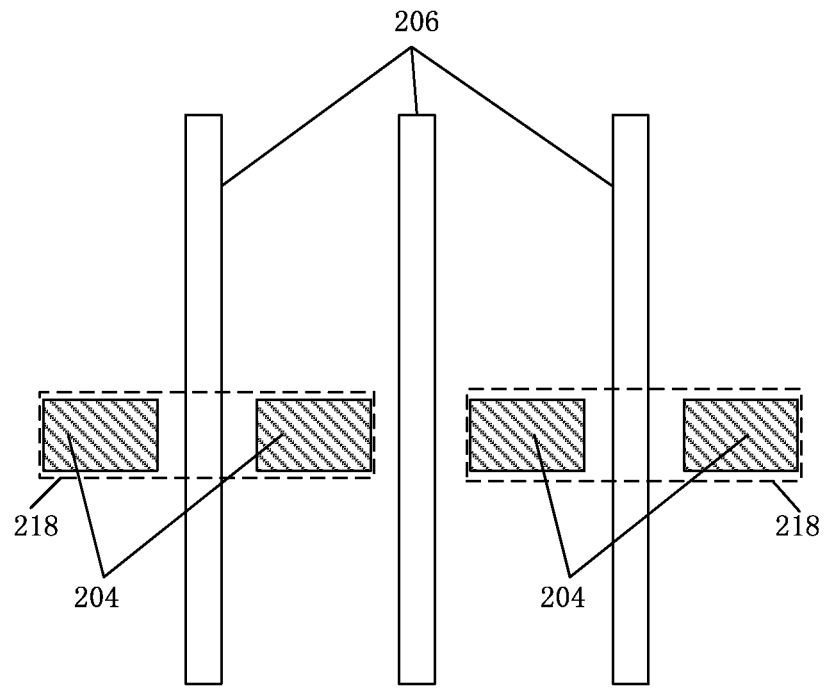
FIG. 4B is a schematic diagram showing a position of a first slot in an array substrate, according to embodiments of the disclosure.
Figure 4C:
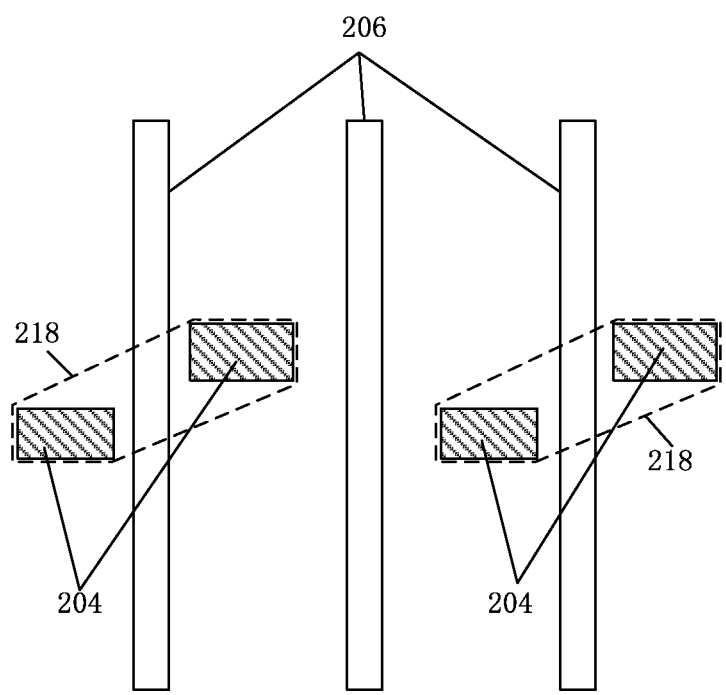
FIG. 4C is a schematic diagram showing a position of a first slot in an array substrate, according to embodiments of the disclosure.

In an actual manufacturing process, as shown in FIG. 4B, two adjacent thin film transistors 22 constitute a thin film transistor group. Two drain electrodes of the thin film transistor group may be aligned with each other in the second direction, in this case, the planarization layer 207 and the first insulation layer 205 are etched at positions above and corresponding to the two drain electrodes 204 of the thin film transistor group, forming the first slot 218 as shown by a dashed box in FIG. 4B. Alternatively, as shown in FIG. 4C, the two drain electrodes of the thin film transistor group are not aligned with each other in the second direction, in this case, the planarization layer 207 and the first insulation layer 205 are etched at positions above and corresponding to the two drain electrodes 204 of the thin film transistor group, forming the first slot 218 as shown by a dashed box in FIG. 4C. The first slot 218 exposes two drain electrodes 204 and the touch wiring 206 at the same time. The common electrode layer is formed on the planarization layer 207 and extends into the first slot 218 along the second direction so as to electrically connect the exposed touch wiring 206. Within the first slot 218, the common electrode 208 is formed only on the exposed touch wiring 206 by etching using the patterning process. Further, the second insulation layer 209 is formed on the common electrode 208 and covers the bottom of the first slot 218. Fourth via holes 219 penetrating through the second insulation layer 209 are formed by etching the second insulation layer 209 and are located right above the drain electrodes 204 within the region of the first slot 218. The pixel electrode layer is formed on the second insulation layer 209 and extends into the fourth via hole 219 along the first direction to connect with the drain electrode 204, thus achieving the electrical connection of the pixel electrode 210 with the drain electrode 204.

In some embodiments, the planarization layer covers the touch wiring layer, making the flatness over the touch wiring better, thus alleviating the light leakage at both sides of the touch wiring after the rubbing process.

Figure 4D:
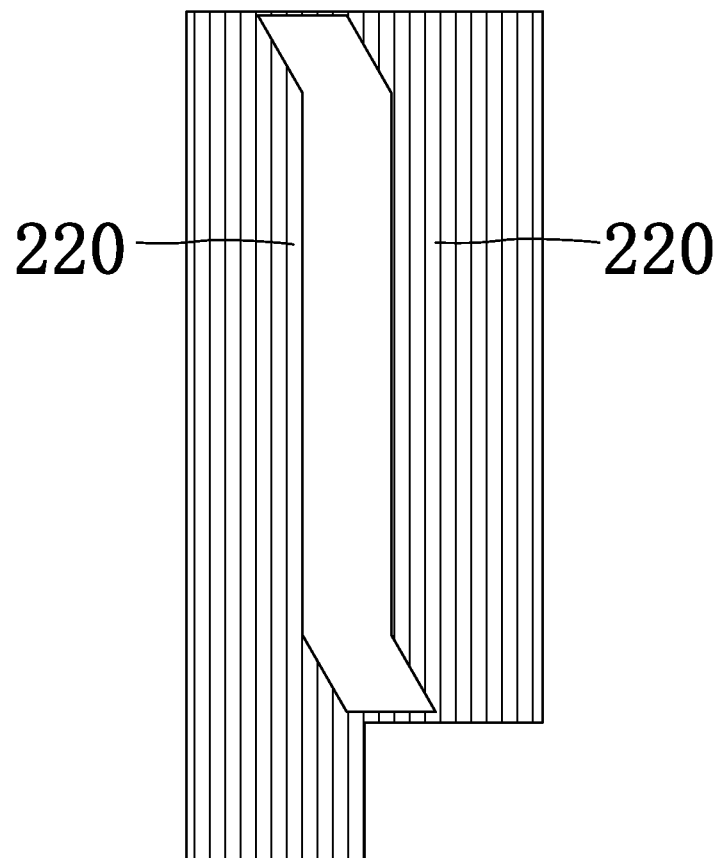
FIG. 4D is a schematic diagram of a pixel electrode in an array substrate, according to embodiments of the disclosure.

The array substrates are preferably suitable for high-resolution liquid crystal display panels. As shown in FIG. 4D, each pixel electrode 210 includes at least two strip-shaped electrodes 220 extending along the second direction.

It should be noted that the above accompanying figures are only illustrative, and the shape and the extending direction of the scan lines and the data lines are not specifically limited in the disclosure. For example, the scan lines and the data lines may have a shape of a straight line, a polygonal line or the like. The arrangement of the thin film transistor 22 and the drain electrode 204 thereof is not specifically limited, for example, the drain electrodes 204 of the thin film transistors 22 may be aligned with each other or not, so long as the first slot 218 extends from the drain electrode 204 of the thin film transistor 22 to the drain electrode 204 of the adjacent thin film transistor 22.

Figure 5:
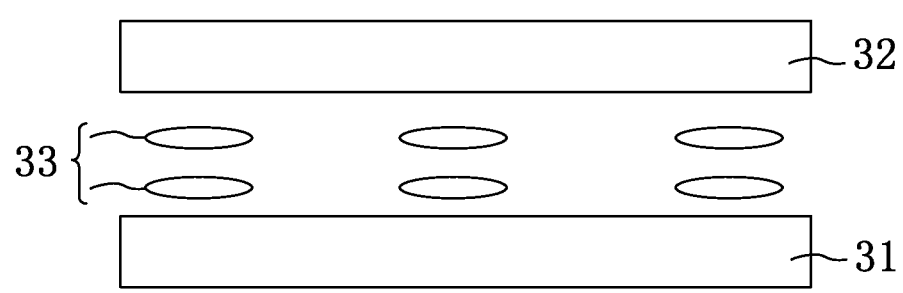
FIG. 5 is a schematic diagram of a touch display panel, according to embodiments of the disclosure.

As shown in FIG. 5, some embodiments include a touch panel display. In addition to the array substrate 31 described above, the touch panel display further includes a color filter substrate 32 arranged opposite to the array substrate 31, and a liquid crystal layer 33 is disposed between the array substrate 31 and the color filter substrate 32.

Figure 6:
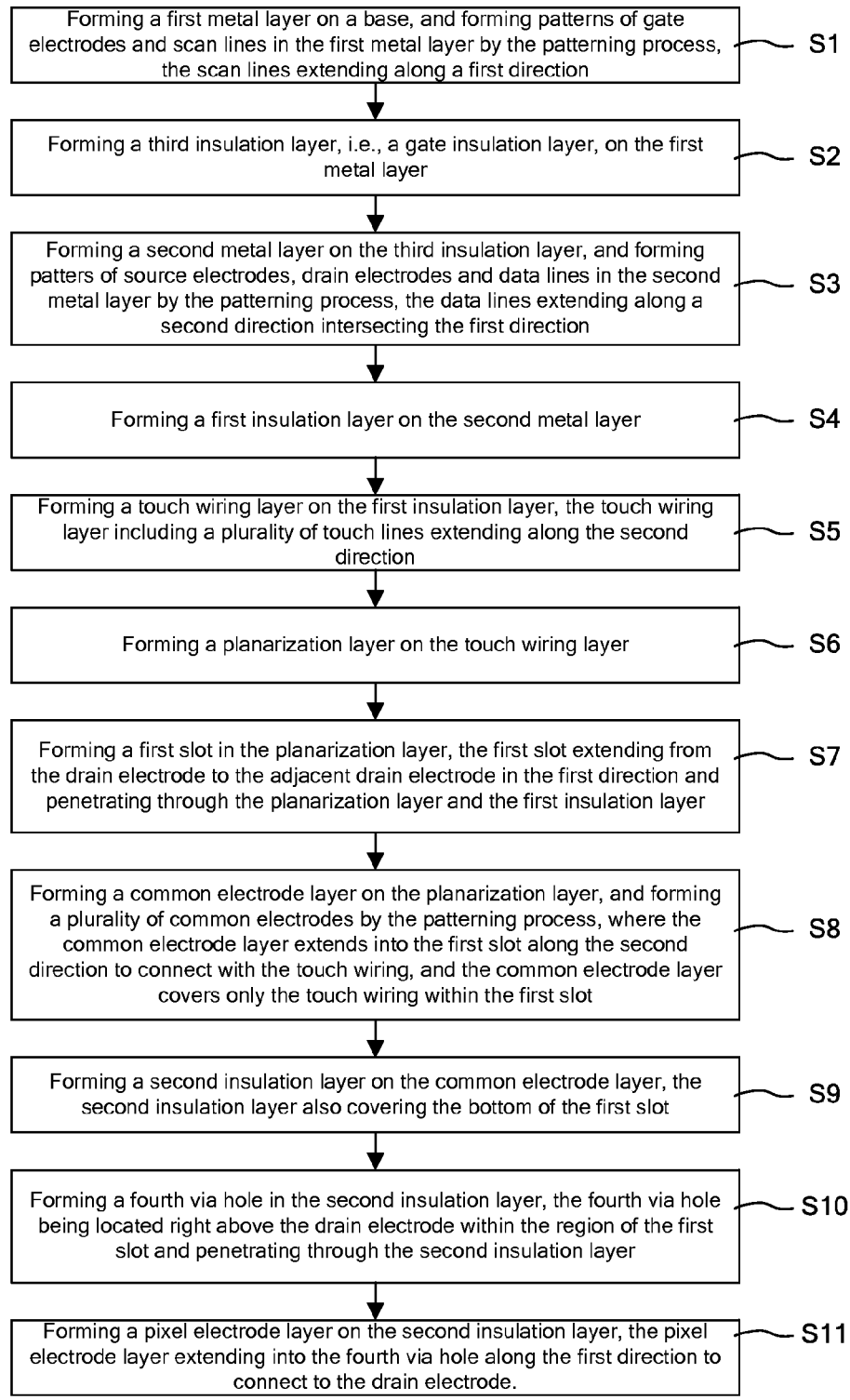
FIG. 6 is a flowchart of a manufacture method of an array substrate, according to embodiments of the disclosure.

FIG. 6 is a flowchart of a manufacturing method of an array substrate, according to embodiments of the disclosure. The method includes the steps of:

S1. forming a first metal layer on a base, and forming patterns of gate electrodes and scan lines in the first metal layer by the patterning process, the scan lines extending along a first direction;

S2. forming a third insulation layer, i.e., a gate insulation layer, on the first metal layer;

S3. forming a second metal layer on the third insulation layer, and forming patterns of source electrodes, drain electrodes and data lines in the second metal layer by the patterning process, the data lines extending along a second direction intersecting the first direction;

S4. forming a first insulation layer on the second metal layer;

S5. forming a touch wiring layer on the first insulation layer, the touch wiring layer including a plurality of touch wirings extending along the second direction; and S6. forming a planarization layer on the touch wiring layer.

The array substrate formed by this method is described above and shown in FIGS. 1-5.

In some embodiments, after forming the planarization layer on the touch wiring layer, the method further includes:

S7. forming a first slot in the planarization layer, the first slot extending from the drain electrode to the adjacent drain electrode in the first direction and penetrating through the planarization layer and the first insulation layer;

S8. forming a common electrode layer on the planarization layer, and forming a plurality of common electrodes by the patterning process, where the common electrode layer extends into the first slot along the second direction to connect with the touch wiring, and the common electrode layer covers only the touch wiring within the first slot;

S9. forming a second insulation layer on the common electrode layer, the second insulation layer also covering the bottom of the first slot;

S10. forming a fourth via hole in the second insulation layer, the fourth via hole being located right above the drain electrode within the region of the first slot and penetrating through the second insulation layer; and S11. forming a pixel electrode layer on the second insulation layer, the pixel electrode layer extending into the fourth via hole along the first direction to connect to the drain electrode.

In some embodiments, the planarization layer covers the touch wiring layer, making the flatness over the touch wiring better, thus alleviating the light leakage at both side of the touch wiring after the rubbing process.

Various modifications and additions can be made to the exemplary embodiments discussed without departing from the scope of the disclosure. For example, while embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

I claim:

1. An array substrate, comprising:
   a base;
   a plurality of thin film transistors arranged in a matrix form, each of which includes a gate electrode, a source electrode and a drain electrode;
   a first insulation layer located on the thin film transistors;
   a touch wiring layer which is disposed on the first insulation layer and comprises a plurality of touch wirings;
   a planarization layer covering the touch wiring layer;
   a common electrode layer located on the planarization layer and comprising a plurality of common electrodes, each of which is connected with one or more of the touch wirings and is operable as a touch sensing electrode;
   a second insulation layer located on the common electrode layer; and
   a pixel electrode layer which is located on the second insulation layer and comprises a plurality of pixel electrodes.

2. The array substrate of claim 1, wherein the planarization layer comprises a first via hole, through which the common electrode is connected with the touch wiring.

3. The array substrate of claim 1, wherein the planarization layer comprises a first via hole, through which the common electrode is directly connected with the touch wiring.

4. The array substrate of claim 2, wherein the second insulation layer comprises a second via hole aligning with the first via hole and a third via hole, and the common electrode is connected with the touch wiring through the first via hole, the second via hole and the third via hole.

5. The array substrate of claim 1, further comprising:
   a plurality of scan lines extending along a first direction, which are located at the same layer as the gate electrode of the thin film transistor; and
   a plurality of data lines, which are located at the same layer as the source electrode and the drain electrode of the thin film transistor and extend along a second direction intersecting the first direction, and an extending direction of the touch wirings is the same as that of the data lines.

6. The array substrate of claim 5, wherein the planarization layer comprises a first slot, which extends from the drain electrode of a thin film transistor to the drain electrode of an adjacent thin film transistor in the first direction.

7. The array substrate of claim 6, wherein the first slot penetrates through the planarization layer and the first insulation layer; the common electrode layer extends into the first slot along the second direction to connect with the touch wiring; only the touch wiring is covered with the common electrode layer within the first slot.

8. The array substrate of claim 7, wherein,
   the second insulation layer covers a bottom of the first slot;
   the second insulation layer further comprises a fourth via hole penetrating through the second insulation layer and located right above the drain electrode within a region of the first slot;
   the pixel electrode layer extends into the fourth via hole to connect with the drain electrode along the first direction.

9. The array substrate of claim 8, wherein each of the pixel electrodes comprises at least two strip-shaped electrodes extending along the second direction.

10. The array substrate of claim 6, wherein two adjacent thin film transistors constitute a thin film transistor group, and two drain electrodes in the thin film transistor group correspond to the same first slot.

11. The array substrate of claim 1, wherein a thickness of the planarization layer is between 0.5 µm and 6 µm.

12. The array substrate of claim 1, wherein the first insulation layer is made of silicon oxide or silicon nitride.

13. The array substrate of claim 1, wherein the second insulation layer is made of silicon oxide or silicon nitride.

14. The array substrate of claim 1, wherein the thin film transistor further comprises an active layer made of amorphous silicon or low-temperature polycrystalline silicon.

15. A touch panel display, comprising the array substrate of claim 1, wherein the touch panel display further comprises a color filter substrate arranged opposite to the array substrate, and a liquid crystal layer disposed between the array substrate and the color filter substrate.

16. A manufacture method of the array substrate, comprising:
- forming a first metal layer on a base, and forming patterns of gate electrodes and scan lines on the first metal layer by a patterning process, wherein the scan lines extend along a first direction;
- forming a third insulation layer on the first metal layer;
- forming a second metal layer on the third insulation layer, and forming patters of source electrodes, drain electrodes and data lines on the second metal layer by the patterning process, wherein the data lines extend along a second direction intersecting the first direction;
- forming a first insulation layer on the second metal layer;
- forming a touch wiring layer on the first insulation layer, the touch wiring layer including a plurality of touch wirings extending along the second direction;
- forming a planarization layer on the touch wiring layer;
- forming a first slot on the planarization layer, the first slot extending from a drain electrode to an adjacent drain electrode in the first direction and penetrating through the planarization layer and the first insulation layer;
- forming a common electrode layer on the planarization layer, and forming a plurality of common electrodes in the common electrode layer by the patterning process, wherein the common electrode layer extends into the first slot along the second direction to connect with the touch wiring, and only the touch wiring is covered with the common electrode layer within the first slot;
- forming a second insulation layer on the common electrode layer, the second insulation layer covering a bottom of the first slot;
- forming a fourth via hole in the second insulation layer, the fourth via hole being located right above the drain electrode within a region of the first slot and penetrating through the second insulation layer; and
- forming a pixel electrode layer on the second insulation layer, the pixel electrode layer extending into the fourth via hole along the first direction to connect to the drain electrode.

17. The array substrate of claim 1, wherein the planarization layer is made by an organic film.

* * * * *